United States Patent [19]
Chrysler et al.

[11] Patent Number: 5,896,922
[45] Date of Patent: Apr. 27, 1999

[54] COLD PLATE FOR DUAL REFRIGERATION SYSTEMS

[75] Inventors: Gregory M. Chrysler, Chandler, Ariz.; Richard C. Chu, Poughkeepsie, N.Y.; Gary F. Goth, Pleasant Valley, N.Y.; Robert E. Simons, Poughkeepsie, N.Y.

[73] Assignee: International Business Machines Corporation, Armonk, N.Y.

[21] Appl. No.: 09/060,847

[22] Filed: Apr. 15, 1998

Related U.S. Application Data

[60] Division of application No. 08/975,852, Nov. 21, 1997, which is a continuation-in-part of application No. 08/896,279, Jul. 16, 1997, abandoned.

[51] Int. Cl.⁶ ......................................... F28F 3/12
[52] U.S. Cl. ........................ 165/165; 165/146; 165/170; 62/259.2
[58] Field of Search ................... 165/164–167, 165/170, 146, 296, 140; 62/259.2

[56] References Cited

U.S. PATENT DOCUMENTS

| | | | |
|---|---|---|---|
| 941,215 | 11/1909 | Wade | 165/164 |
| 1,770,254 | 7/1930 | Seligman | 165/167 X |
| 1,828,477 | 10/1931 | Seligman | 165/164 |
| 2,160,928 | 6/1939 | Voorhees | 165/167 |
| 2,217,316 | 10/1940 | Kallstenius | 165/167 |
| 2,565,816 | 8/1951 | Jones | 165/164 |
| 3,055,642 | 9/1962 | Cox et al. | 165/170 X |
| 4,514,746 | 4/1985 | Lundqvist . | |
| 4,523,638 | 6/1985 | Rosman et al. | 165/167 |
| 4,623,019 | 11/1986 | Wiard | 165/146 |
| 4,665,466 | 5/1987 | Green . | |
| 4,793,405 | 12/1988 | Diggelmann et al. . | |
| 5,035,284 | 7/1991 | Oya et al. | 165/146 |
| 5,036,677 | 8/1991 | Neuenfeldt et al. . | |
| 5,057,968 | 10/1991 | Morrison . | |
| 5,069,041 | 12/1991 | Thielman et al. . | |
| 5,170,319 | 12/1992 | Chao-Fan Chu et al. | 361/699 |
| 5,343,940 | 9/1994 | Jean . | |
| 5,365,749 | 11/1994 | Porter . | |
| 5,394,936 | 3/1995 | Budelman . | |
| 5,457,603 | 10/1995 | Leeb . | |
| 5,471,850 | 12/1995 | Cowans . | |
| 5,474,120 | 12/1995 | Severson et al. | 165/298 |
| 5,709,100 | 1/1998 | Baer et al. | 62/259.2 |

FOREIGN PATENT DOCUMENTS

| | | | |
|---|---|---|---|
| 799501 | 6/1936 | France | 165/170 |
| 52-5040 | 1/1977 | Japan | 165/164 |
| 39881 | 3/1907 | Switzerland | 165/170 |
| 23517 | 8/1915 | United Kingdom | 165/167 |
| 629960 | 10/1949 | United Kingdom | 165/170 |

*Primary Examiner*—Allen J Flanigan
*Attorney, Agent, or Firm*—Lawrence D. Cutter

[57] ABSTRACT

A cold plate includes two flow-wise isolated coolant (or refrigerant) passages (or sets of passages) for use in conjunction with separate refrigeration systems. The cold plate passages do not permit flow communication between distinct coolant (or refrigerant) paths. This permits two distinct cooling systems to operate in a redundant manner. Nonetheless, flow isolation is achieved while still maintaining tight thermal coupling between each path and the object, such as an electronic computer processor module, to be cooled.

3 Claims, 13 Drawing Sheets

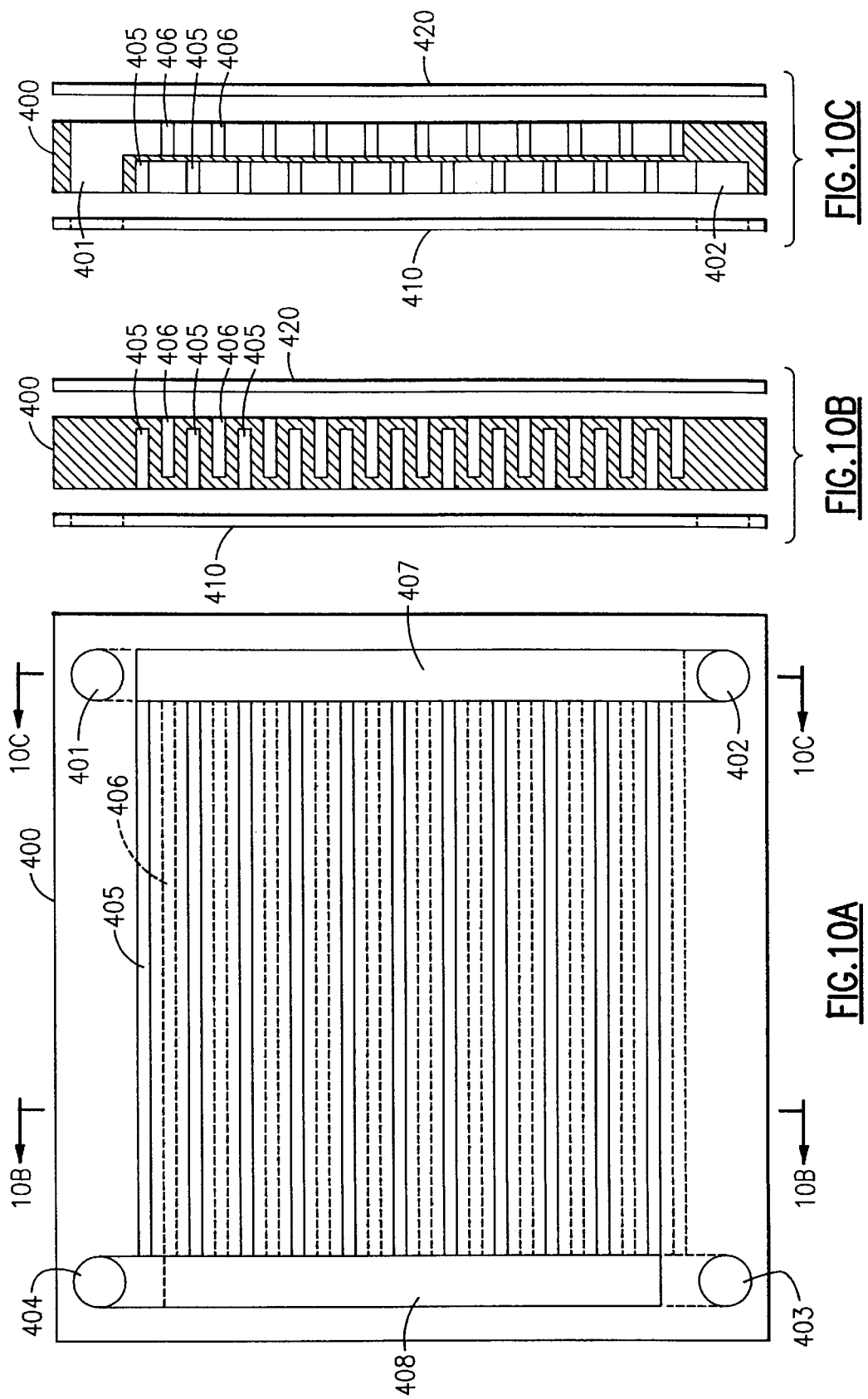

COLD PLATE FOR DUAL REFRIGERATION SYSTEMS

This is a divisional application of Ser. No. 08/975,852 filed on Nov. 21, 1997, which is a continuation-in-part of Ser. No. 08/896,279 filed on Jul. 16, 1997, now abandoned.

BACKGROUND OF THE INVENTION

The present invention is generally directed to providing reliable cooling systems for mainframe computer systems or for any electronic system requiring cooling. More particularly, the present invention is directed to a redundant refrigeration system employing a single cold plate which preserves flow isolation between the fluids in the redundant systems. In another aspect of the present invention, there is provided a combination of air and redundant refrigeration cooling for an electronic device such as a mainframe or server processing unit disposed within a cabinet possibly along with other less thermally critical components. In yet another aspect of the present invention, there is provided a modular refrigeration unit capable of operating continuously in a variety of ambient conditions and under a variety of thermal loads.

In recent years, the semiconductor industry has taken advantage of the fact that CMOS circuits dissipate less power than bipolar circuits. This has permitted more dense packaging and correspondingly faster CMOS circuits. However, almost no matter how fast one wishes to run a given electronic circuit chip, there is always the possibility of running it faster if the chip is cooled and thermal energy is removed from it during its operation. This is particularly true of computer processor circuit chips and even more particularly true of these chips when disposed within multi-chip modules which generate significant amounts of heat. Because there is a great demand to run these processor modules at higher speeds, the corresponding clock frequencies at which these devices must operate become higher. In this regard, it should be noted that it is known that power generation rises as a function of the square of the clock frequency. Accordingly, it is seen that the desire for faster computers generates not only demand for computer systems but also generates thermal demands in terms of energy which must be removed for faster, safer and more reliable circuit operation. In this regard, it is to be particularly noted that, in the long run, thermal energy is the single biggest impediment to semiconductor operation integrity.

In addition to the demand for higher and higher processor speeds, there is also a concomitant demand for reliable computer systems. This means that users are increasingly unwilling to accept down time as a fact of life. This is particularly true in the mainframe and server realms. Reliability in air-cooled systems is relatively easily provided by employing multiple air-moving devices (fans, blowers, etc.). Other arrangements which incorporate a degree of redundancy employ multiple air-moving devices whose speeds can be ramped up in terms of their air delivery capacity if it is detected that there is a failure or need within the system to do so. However, desired chip-operating power levels are nonetheless now approaching the point where air cooling is not the ideal solution for all parts of the system in all circumstances. While it is possible to operate fans and blowers at higher speeds, this is not always desirable for acoustic reasons. Accordingly, the use of direct cooling through the utilization of a refrigerant and a refrigeration system becomes more desirable, especially if faster chip speeds are the goal.

However, it is difficult to build redundancy into systems employing refrigerants. Such redundant systems naturally require the utilization of at least two separate refrigeration systems. This means that at least two motor-driven compressors are required. However, it is well recognized that the compressor, representing a major moving part apparatus, is also one which is prone to mechanical failure. The desire for zero down time and minimum maintenance requirements also make the utilization of multiple compressors difficult. These compressors should be designed, controlled and set up so that various failure modalities do not bring the entire computer system down nor risk damage to the components within the system. Furthermore, one should also be concerned about refrigerant leaks. Accordingly, the refrigerant systems for redundant cooling must be designed so that the refrigerant loops are not in flow communication with one another so that a leak in one loop would bring down the whole system. However, there are great practical difficulties in doing this since it requires two separate loops which are maintained in flow-wise isolation from one another and yet, at the same time, requires the utilization of refrigerant loops which are in very close thermal proximity with one another at the point within a cold plate which is attached (or otherwise thermally coupled) to the electronic circuit module or system to be cooled.

While certain electronic components or modules produce relatively large amounts of thermal energy, it is often the case that these modules are employed in conjunction with other electronic circuit components which also require some degree of cooling but do not operate at temperatures so high as to require direct cooling via a cold plate and/or refrigerant system. If modules of varying thermal energy output are employed in the same system, it is therefore desirable that the cooling systems employed for the lower thermal output modules be cooled in a manner which is compatible with cooling systems employed for the higher temperature modules. To the extent that a degree of cooperation between these systems can be provided, the net result is a system which is even more reliable and dependable. Nonetheless, these dual cooling modalities must be accommodated within a single cabinet or frame.

Another very desirable feature of any system which is employed to cool electronic devices and systems, particularly computer systems, is that a separate chilled water source not be necessary. While in some situations where the requirements are such that the inconvenience of chilled water plumbing is offset by the needs and/or desires for extremely rapid computation and computer throughput, nonetheless, less stringent requirements for computational speed are nonetheless preferably addressed through the utilization of machines which are air cooled. This cooling methodology is desirable in that it permits the utilization of stand-alone units. These self-contained units are, everything else being equal, a generally preferred solution to providing data processing server solutions.

There are yet other requirements that must be met when designing cooling units for computer systems, especially those which operate continuously and which may in fact be present in a variety of different thermal environments. Since computer systems run continuously, so must their cooling systems unlike a normal household or similar refrigerator which is operated under a so-called bang-bang control philosophy in which the unit is alternating either totally on or totally off. Furthermore, since large computer systems experience, over the course of time, say hours, variations in user load and demand, the amount of heat which must be removed also varies over time. Therefore, a cooling unit or cooling module for a computer system must be able not only to operate continuously but also be able to adjust its cooling capability in response to varying thermal loads. And furthermore, since it is intended that these modular cooling units be used in groups of two or more to assure redundancy and since not all of these units are always intended to be operating at the same time, there will be times when the thermal load is very small. Therefore, problems associated with low speed motor/compressor operation must be addressed along with problems associated with starting and/or stopping the cooling unit when, for example, normal scheduled switching between modular refrigeration units occurs.

SUMMARY OF THE INVENTION

In accordance with a preferred embodiment of the present invention, an apparatus for cooling electronic circuits comprises a special cold plate with dual coolant flow passages. These passages are isolated from one another in the sense that they are not in flow communication and yet, nonetheless, these coolant flow passages are still in intimate thermal contact with one another within the cold plate. In conjunction with this cold plate, first and second refrigeration systems are employed to provide a desired degree of redundancy. Each of these refrigeration systems includes a compressor, condenser and expansion device connected in a closed refrigerant loop with one of the passages in the dual-passage cold plate. In preferred embodiments of the present invention, there is also provided a control mechanism for operating the first and second refrigeration systems in a time-alternating fashion. Additionally, in preferred embodiments, there is also provided a mechanism for reducing the power produced by the electronic system which is being cooled in the event of a failure in one of the refrigeration loops.

In another embodiment of the present invention, a redundantly cooled electronic system comprises a cabinet which has an air intake and an air exhaust. A planar circuit board, together with an electronic module disposed on the planar circuit board, is contained within the cabinet. An air-moving mechanism is provided for moving air from the inlet opening to the exhaust opening past the electronic module. The electronic module (processor) has a cold plate which is in thermal contact with it. The cold plate is as described above and possesses first and second coolant passages which are in turn connected to redundant first and second refrigeration systems. It is noted that in the description contained herein, the reference to a redundant cooling system is primarily directed to the notion that two separate and isolated refrigeration systems are supplied. However, in a lesser intended sense, the term "redundant" also applies to the notion that in the event of a complete failure in both of the refrigeration systems, a certain amount of air cooling can and will take place as the computer system or other cooled electronic system is being shutdown.

In yet another embodiment of the present invention, a modular refrigeration unit (MRU) is provided for supplying cooled refrigerant to one side of a dual-loop evaporator/cold plate. The MRU is enabled for continuous operation under various loads and in various thermal environments through the inclusion of a direct current (dc) motor together with the further inclusion of a hot gas bypass value (HGBV) which bypasses the condenser and thermal expansion valve when the motor/compressor unit is operating under low thermal load conditions or upon startup. The unit is packaged in a single module which is easily coupled into an already running computer processing system via two quick disconnect refrigerant lines, a power cable and a signal cable.

Accordingly, it is an object of the present invention to provide a system and method for cooling computer and other electronic systems.

It is another object of the present invention to provide a cooling system which possesses redundancy for the purpose of providing uninterrupted use of electronic equipment.

It is also an object of the present invention to provide a cooling system for electronic equipment which essentially preserves its stand-alone, air-cooled nature.

It is yet another object of the present invention to provide a cooling system for electronic components in which air and refrigerant cooling are combined in an integrated package.

It is a still further object of the present invention to provide a cooling system for electronic assemblies, modules and cards.

It is also an object of the present invention to provide a mechanism which utilizes two refrigerant loops which are thermally coupled but yet which are flow-wise isolated from one another.

It is an object of the present invention to provide a cooling system for electronic components which include fail-safe means for operation in the event of a number of different failure modalities, including refrigerant leakage.

It is also an object of the present invention to provide a system and method for continued computer usage in the event of cooling system problems.

It is a still further object of the present invention to provide a cold plate for electronic component cooling which preserves refrigerant flow isolation while at the same time maintaining good thermal connectivity to a module to be cooled and also provides good thermal conduction and flow-wise isolation between dual refrigerant loops.

It is a still further object of the present invention to provide an electronic component cooling system which is self contained.

It is also an object of the present invention to provide a computer or electronic system in which the refrigerant cooling system is a rack-mountable, field-replaceable unit.

It is also an object of the present invention to provide a cooling system for an electronic module which can be attached to a refrigeration system by means of flexible and detachable refrigerant supply lines.

It is yet another object of the present invention to provide a refrigeration unit which is capable of operating continuously.

It is still another object of the present invention to provide a refrigeration unit which is capable of variable heat removal capacity, particularly in response to varying thermal demands.

It is a still further object of the present invention to provide a refrigeration unit which is easily startable, easily shut down and is capable of running under low thermal load situations.

It is also an object of the present invention to provide a refrigeration system which is capable of operating in a wide range of ambient and thermal load conditions.

Lastly, but not limited hereto, it is an object of the present invention to provide a system and method for facilitating the operation of computer systems at higher speeds and, in particularly, for doing so in a reliable manner so as to be able to maintain such systems in continuous operation for as long a time as is reasonably possible.

BRIEF DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

FIG. 10A is a top view of a cold plate center portion illustrating an alternative parallel path arrangement for thermally coupled, yet flow-wise isolated channels;

FIG. 10B illustrates a cross-sectional view through the cold plate of FIG. 10A;

FIG. 10C is a cross-sectional view similar to FIG. 10B more particularly showing the cross section through an end manifold portion;

DETAILED DESCRIPTION OF THE INVENTION

Figure 1A:
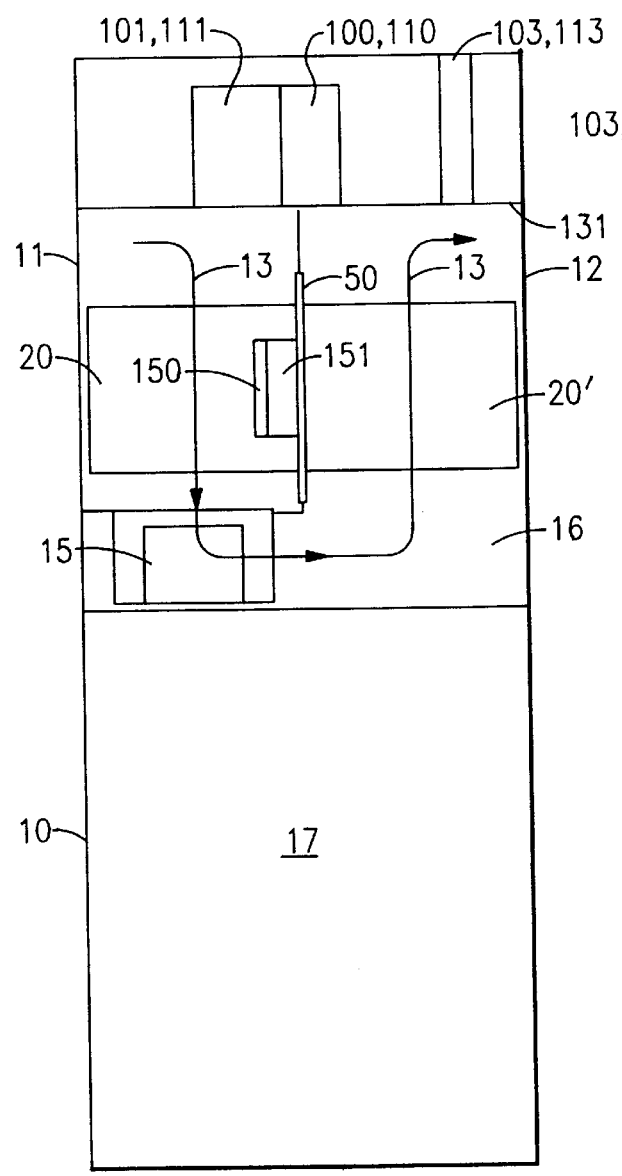
FIG. 1A is a side elevation view illustrating the arrangement of components in a preferred embodiment of the present invention.

FIG. 1A illustrates a side view of one embodiment of the present invention. This invention employs cabinet 10 having inlet opening 11 and outlet opening 12 for the passage of air therethrough. The flow of air is induced by means of one or more blowers 15. Fans or other air-moving devices could also be employed for this same purpose. However, blowers are preferred because of their efficiency. In the apparatus shown in FIG. 1A, air moves from inlet 11 in cabinet 10 to exhaust 12 along air flow line 13. The flow of air is employed for the particular purpose of cooling certain of the electronic components disposed on printed circuit cards or so-called "books" 20. Air flows down between these books or cards through blower(s) 15 to plenum 16 and thence through cards 20' on the other side of mother board 50 into which books 20 are inserted. Thus, having flowed passed cards 20 and 20', air stream 13 exits through exhaust 12 in cabinet 10.

Figure 1B:
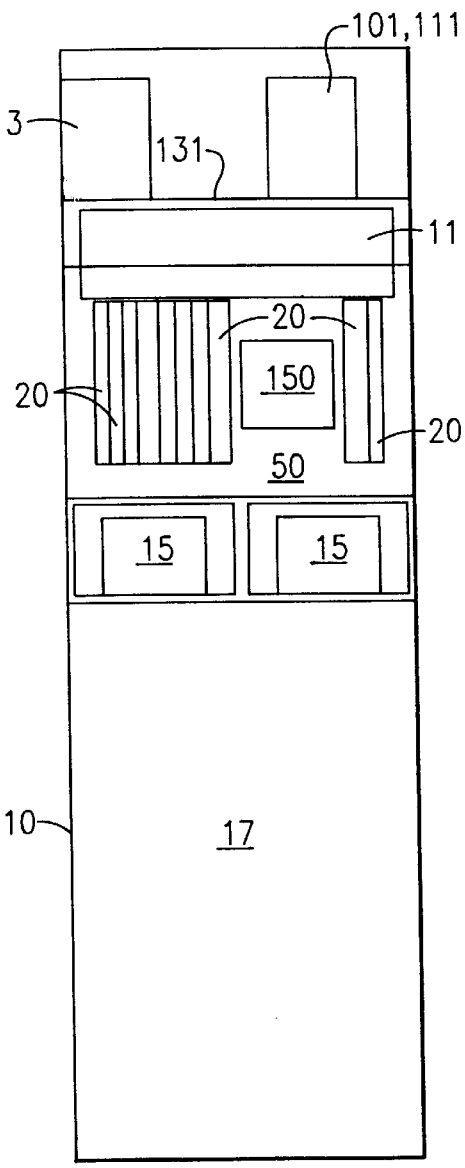
FIG. 1B is a view similar to FIG. 1A but more particularly illustrating a front view.

The description provided thus far is therefore seen to disclose the primarily preferred method for cooling certain ones of the electronic components, namely, those components located on cards 20 and 20' which are of sufficiently low power that air cooling is an appropriate modality. However, a major aspect of the present invention is directed to the specific means and systems employed for cooling electronic module 151. In preferred embodiments of the present invention, module 151 includes circuits for data processor components associated with a mainframe or server computer system. In particular, the system shown in FIGS. 1A and 1B illustrates the placement of cold plate 150 which forms a significant aspect of one embodiment of the present invention. Cold plate 150 is connected by means of flexible refrigerant lines (not shown for clarity) to a refrigeration system present in the upper portion of cabinet 10 above shelf 131. The refrigeration system for cooling cold plate 150 and, thus, module 151 includes items such as motors, compressors and condensers together with an expansion device. Thus, the system shown in FIGS. 1A and 1B represents an apparatus in which both air cooling and direct refrigerant cooling is employed. It is particularly useful for a proper understanding to note that electronic chip module 151 is not mounted in a sideways fashion as are cards 20 primarily because of the fact that module 151 typically possesses a very large number of pins for achieving connection and communication with other circuits in the computer and/or with other computer systems. Thus, the I/O (input/output) pin requirements for module 151 dictate that it preferably be mounted in the fashion shown. In FIG. 1B, this electronic module is shown disposed beneath cold plate 150 which is visible in FIG. 1B.

As shown in the figures, area 17 may include the same components as shown in the top half of the cabinet. Additionally, area 17 may also include power supply components (a power cage, e.g.) along with its own air-moving device. However, the components disposed in area 17 are not otherwise relevant to the present invention.

Figure 2:
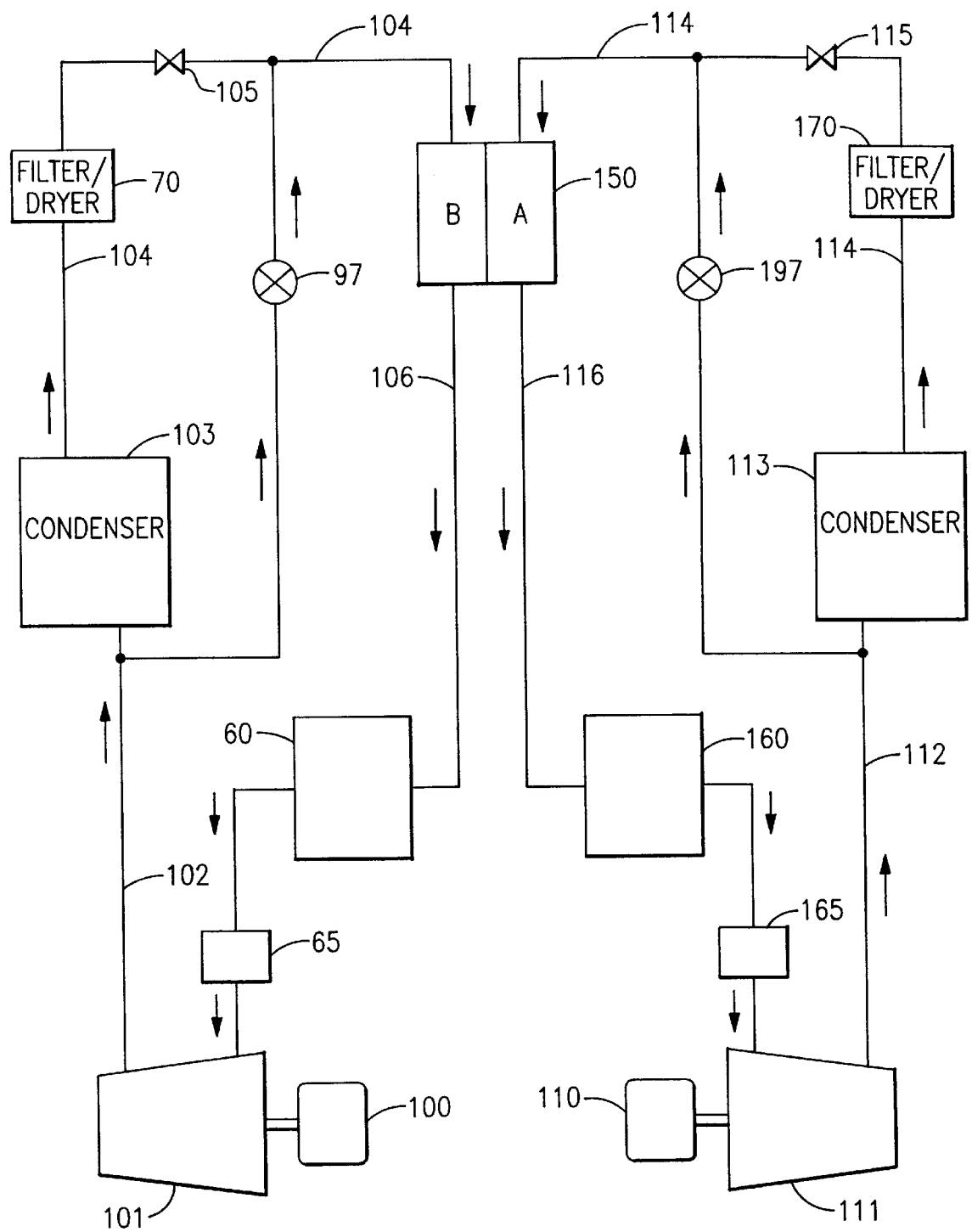
FIG. 2 is a block diagram illustrating a dual redundant refrigeration system for utilization with a cold plate in accordance with the present invention.

In order to provide the desired degree of system cooling redundancy, a dual refrigeration system, such as that shown in FIG. 2, is provided in accordance with preferred embodiments of the present invention. The heart of this dual refrigeration system is the inclusion of cold plate 150 which has contained therein isolated coolant passages for a first refrigerant loop (circuit A) and a second refrigerant loop (circuit B). The cold plate itself may be constructed in several different ways. The cold plate and its construction is more particularly described below with reference to FIGS. 8A, 8B, 9A, 9B, 10A, 10B and 10C. The primary feature of cold plate 150 is that the coolant passages contained therein are isolated from one another in a flow-wise fashion. That is, cold plate 150 is designed so as to prevent leakage or seepage from one refrigerant loop (circuit A) to the other refrigerant loop (circuit B). Nonetheless, in spite the flow-wise isolation, the two coolant loops provided are, nonetheless, in intimate thermal contact with one another and with the body of the cold plate so as to remove heat from module 151 in an efficient manner.

Thus, in accordance with the redundancy requirements of the present invention, FIG. 2 illustrates a refrigerant system for circuit A and a refrigerant system for circuit B. In particular, motor 100 drives compressor 101 which is connected to condenser 103 by means of supply line 102. Likewise, condenser 103 is connected to circuit B for cold plate 150 by means of supply line 104 which passes through filter/dryer 70 which functions to trap particulate matter present in the refrigerant stream and also to remove any water which might have become entrained in the refrigerant flow. Subsequent to filter/dryer 70, refrigerant flow passes through expansion device 105. Expansion device 105 is preferably an expansion valve. However, it may also comprise a capillary tube or thermostatic valve. Thus, expanded and cooled refrigerant is supplied to circuit B in cold plate 150. Subsequent to its picking up heat from module 151 through the body of cold plate 150, the refrigerant is returned via return line 106 to accumulator 60 which operates to prevent liquid from entering compressor 101. Accumulator 60 is also aided in its function by the inclusion of smaller capacity accumulator 65 which is included in preferred embodiments of the present invention to provide an extra degree of protection against the entry of liquid phase refrigerant into compressor 101. Subsequent to accumulator 65, vapor phase refrigerant is returned to compressor 101 where the cycle repeats. In addition, circuit A is provided with hot gas bypass value (HGBV) 97 which, as its name suggests, operates to pass hot refrigerant gasses from compressor 101 directly to cold plate 150. HGBV 97 is controllable in response to the temperature of cold plate 150 which is provided by module temperature sensor 185 which is preferably a thermistor device affixed to cold plate 150 at any convenient location. In preferred embodiments, HGBV 97 (and other HGBVs discussed herein) are electronically controlled. The HGBVs preferably employed herein are continuously throttleable but are currently operated in fully open and fully closed modes for convenience of design. The HGBVs operate to shunt hot gasses directly to cold plate 150 when its temperature is already sufficiently low. In particular, under these low temperature conditions, motor 100 runs at a lower speed in response to the reduced thermal load. At these lower speeds and loads, there is the danger of motor 101 stalling. Upon detection of such a condition, HGBV 97 is opened in response to a signal supplied to it from microprocessor control 195 (see FIG. 3).

In an exactly analogous fashion, refrigerant flows in the loop in circuit A which includes compressor 111, line 112, condenser 113, filter/dryer 170, expansion device 115, cold plate 150, return line 116 which connects to accumulator 160, which in turn connects (side A) to smaller accumulator 165 and thence back to compressor 111 which is driven by motor 110. As in circuit B, circuit A also includes HGBV 197, as shown.

The system shown in FIG. 2 lends itself to operation in several different modes. For example, it is possible to design each of the two separate refrigeration systems so that each one is capable of removing all of the desired heat generated by electronic module 151. If such is the case, it is not necessary to run both refrigeration systems at the same time. Nonetheless, because of the desirability of maintaining seals in a wetted or moistened state, it is not desirable to shut off either one of the two refrigeration systems for extended periods of time. Thus, in the circumstance where either refrigeration system is capable of providing the desired cooling, it is desired to control these systems in a manner so that as one is being shut down, the other is being turned on and being brought up to speed so that the other system may "rest". In preferred methods of operation, the separate refrigeration systems are each run for about 24 hours, at which time the other system is brought online and the first system is shortly thereafter shut down.

Figure 3:
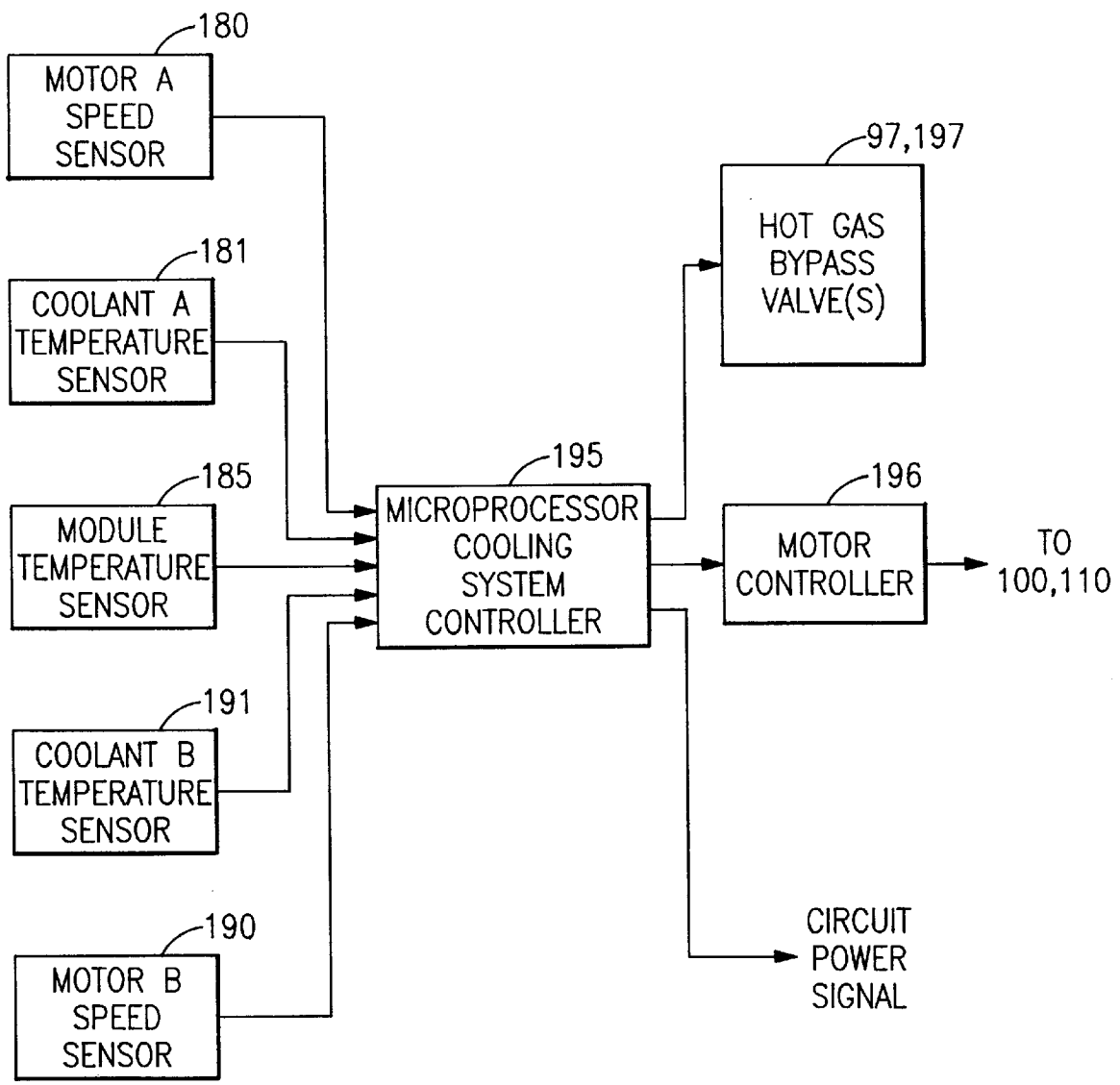
FIG. 3 is a block diagram illustrating the control system for operation of the redundant system shown in FIG. 2.

In those circumstances where the design of the refrigerant portions of the cooling system is such that both systems are required during normal operation, one must consider the possibility of the proper course of action to follow in the event that one of the refrigeration systems fails. Clearly, soft failure modalities are preferred. In order to effectuate such control, certain instrumentation readings are preferably provided to microprocessor cooling system controller 195, as shown in FIG. 3. Controller 195 has, as its principal design object, control of the temperature of module 151 and/or cold plate 150. In particular, desirable inputs for the cooling system controller include speed sensor 180 for motor A, speed sensor 190 for motor B, coolant temperature sensor 181 for circuit A, coolant temperature sensor 191 for circuit B and module temperature sensor 185 for module 151 and/or cold plate 150. Temperature sensors 181 and 191 are placed at the compressor exhaust and are used primarily for diagnostic purposes. Based upon these signal inputs, cooling system controller 195 provides signals to motor controller 196 to turn on either or both of motors 100 and 110 in FIG. 2. Additionally, cooling system controller 195 also preferably provides a "circuit power signal" which is provided as input to electronic processor module 151 as a signal that there is a cooling system problem and that the module should be operated at reduced power levels, say for example, by causing a reduction in the clock speed. In this manner, a solution to the cooling system problem including refrigerant or refrigeration system replacement may be effected while at the same time maintaining computer center operations although at a reduced pace and at a concomitantly reduced thermal load. Furthermore, in normal modes of operation, microprocessor controller 195 also controls HGBVs 97 and 197, as discussed above. Microprocessor controller 195 may comprise a processor unit dedicated to control purposes or, in fact, the functions of microprocessor 195 may be provided by programming code running within computer processor modules which are cooled by the refrigeration system herein and more particularly by programming running within microcoded portions of such a computer processor.

Figure 4:
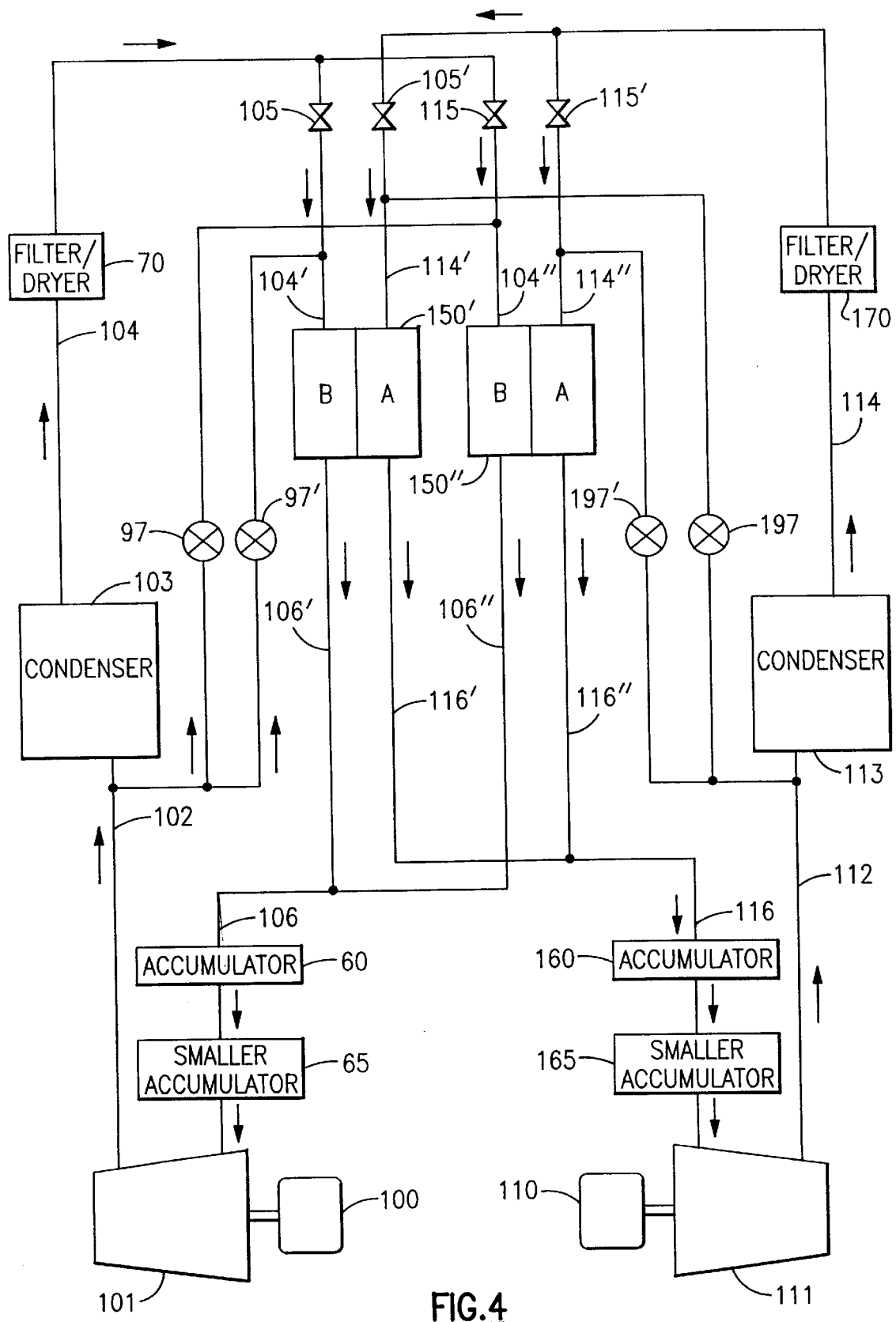
FIG. 4 is a functional block diagram illustrating an arrangement for a redundant cooling system for multiple electronic modules.

The redundant cooling system, shown in FIG. 2, is also employable in those situations where more than one electronic module is to be cooled. In these circumstances, each module is provided with its own cold plate and with its own expansion device. Accordingly, FIG. 4 illustrates the situation in which both cold plates 150' and 150" are to be cooled. In the situation shown in FIG. 4, each of the cold plates possesses dual passages which are thermally coupled but which are flow-wise isolated, that is, there is no flow communication between these passages.

Redundant cooling with flow isolation and refrigerant separation is maintained in the system shown in FIG. 4 by providing a supply line from condenser 103 to side B of cold plate 150' through line 104, filter/dryer 70, expansion device 105 and line 104'; similarly, supply line 104" supplies the circuit for side B of cold plate 150" from expansion device 115. Circuit B in both cases is completed by means of return lines 106' and 106" which return refrigerant from 150' and 150", respectively, either directly to compressor 101 or to common return line 106. (Accumulators 60 and 65, shown in FIG. 2, are also shown in FIG. 4.) Hot gas bypass valves 97 and 97' serve the same function as described above, only now HGBV 97 and HGBV 97' are controlled as a function of the temperature of cold plate 150' and HGBV 197' and HGBV 197 are controlled as a function of the temperature of cold plate 150". An exactly analogous system is provided for circuit loop A in cold plate 150" through the supply and return lines shown which include compressor 111, condenser 113, filter/dryer 170, HGBVs 197 and 197' and accumulators (160 and 165), and expansion devices 105' and 115' in a refrigerant loop.

Figure 5:
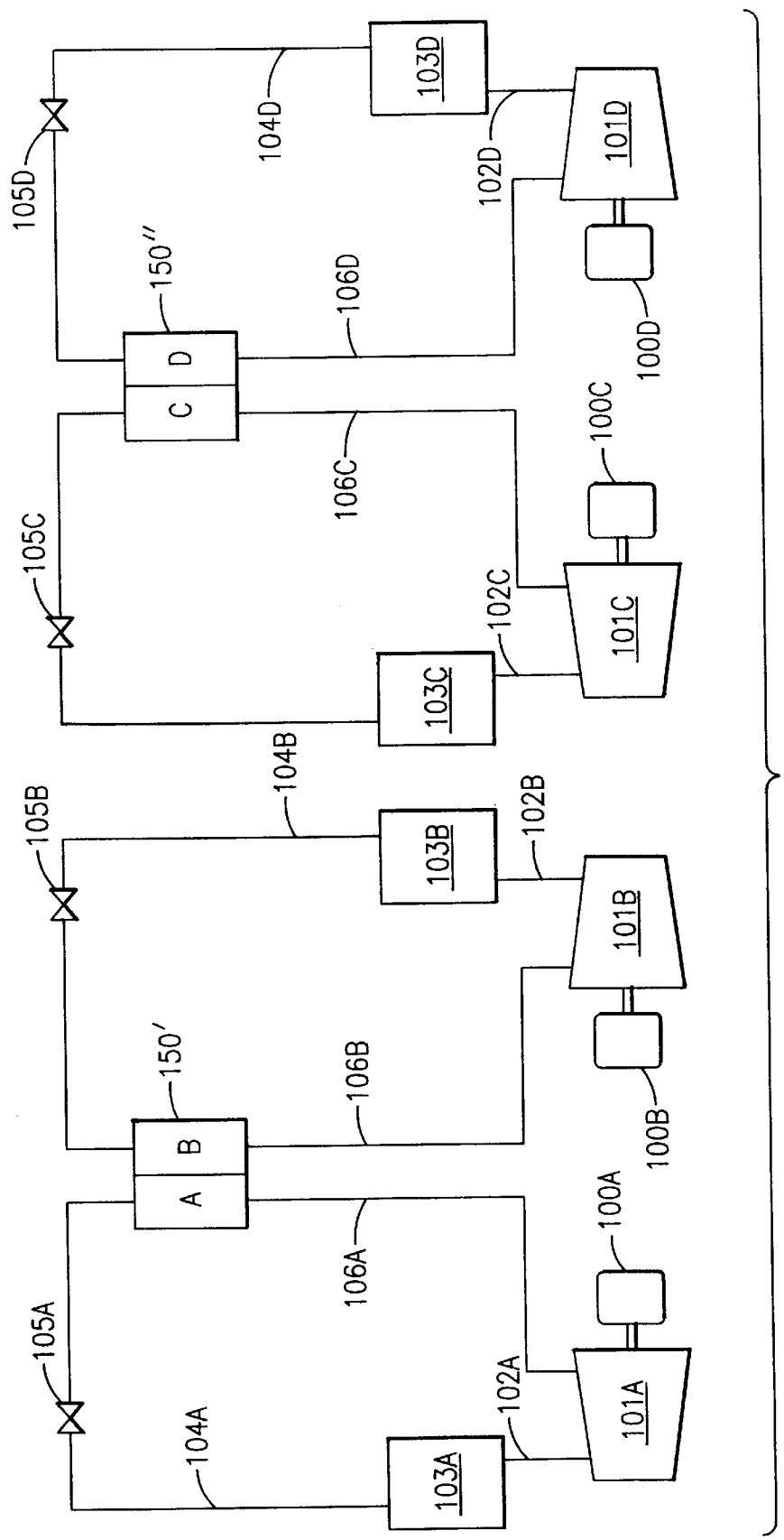
FIG. 5 is a view similar to FIG. 4 illustrating an alternative arrangement for the situation where multiple modules must be cooled.

FIG. 5 illustrates in simplified form another approach to the problem of cooling multiple modules 150' and 150". (For simplicity and ease of understanding, filter/dryers, accumulators and HGBVs are not shown since their placement and use is already clear from FIGS. 2 and 4.) In the embodiment shown in FIG. 5, the arrangement shown in FIG. 2 is essentially replicated for new cold plate 150". In the embodiment shown in FIG. 5, there are accordingly four separate cooling loops, namely, circuits A and B associated with compressors 101A and 101B, respectively. Likewise, coolant loops for sides C and D of evaporator 150" are associated with compressors 101C and 101D together with their appropriately and correspondingly labeled associated elements such as supply and coolant lines, expansion devices, condensers and motors. The multi-chip cooling solution illustrated in FIG. 5 is one possible alternative; however, it is not a preferred alternative in that it doubles the number of components (motors, compressors, condensers, accumulators, filter/dryers, HGBVs, etc.) that are required.

Figure 6:
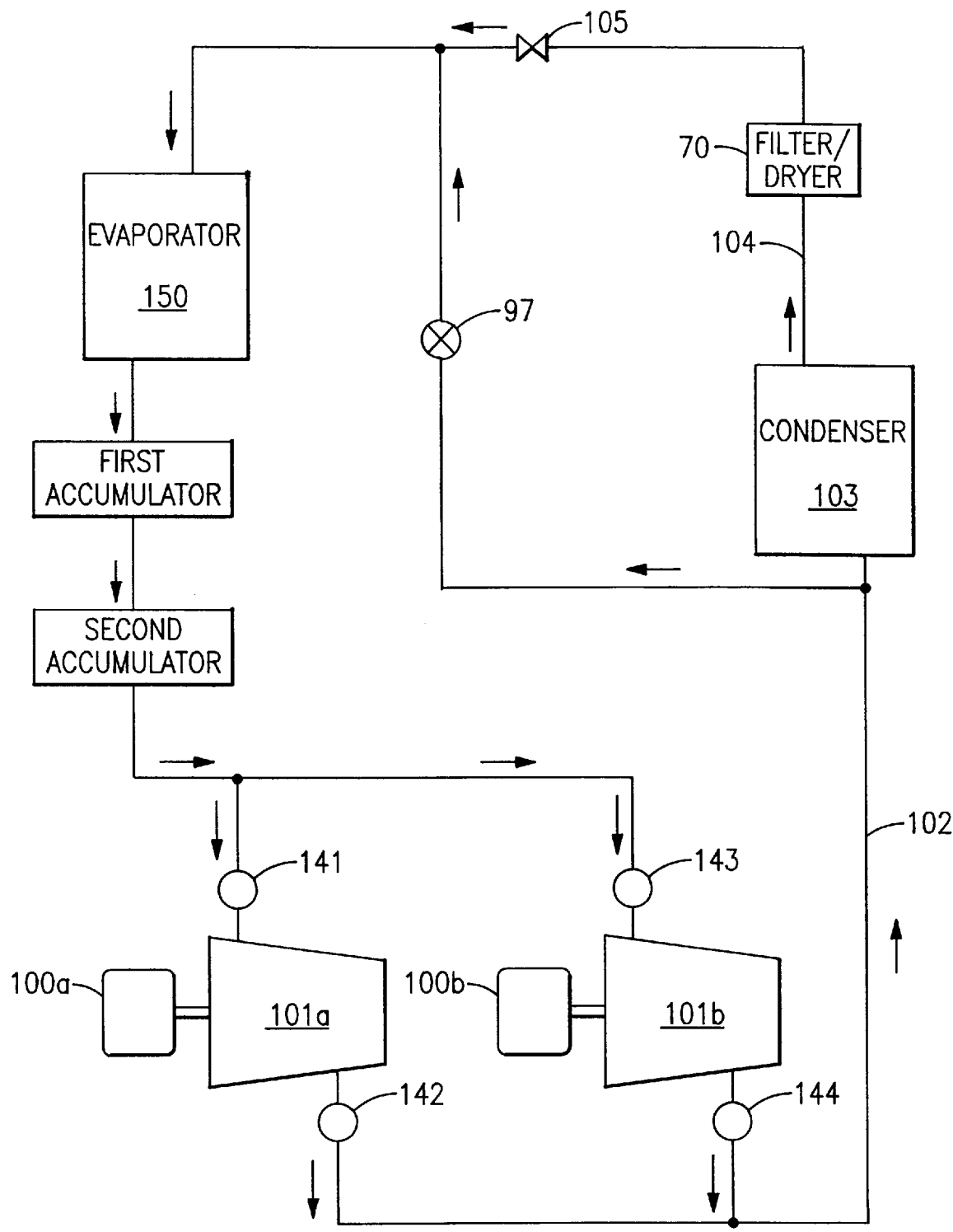
FIG. 6 is a functional block diagram illustrating an alternate redundancy arrangement for cold plate cooling.

Yet another embodiment which provides redundancy in a refrigeration cooling system for cold plate 150 is shown in FIG. 6. In this embodiment, redundancy is provided only insofar as the motors (100a and 100b) and the compressors (101a and 101b) are concerned. FIG. 6 has the advantage in that cold plate redesign is not required. In such an embodiment, cold plate 150 includes only a single coolant flow passage.

Nonetheless, the embodiment shown in FIG. 6 does provide a degree of redundancy by providing two motors and two compressors for compressing the refrigerant which is supplied to them via return line 106 from smaller accumulator 65 which is connected in the compressor return line to larger accumulator 60. The embodiment shown in FIG. 6 does not, however, provide redundancy protection, in the event that there is a problem (for example, a leak) in supply line 102, in condenser 103, in supply line 104, in expansion device 105, in cold plate 150 or in return line 106. Accordingly, the degree of redundancy protection provided by this embodiment is limited. Nonetheless, there is redundancy in that the electronic module cooled by cold plate 150 may still receive coolant from an operative one of the motor/compressor combinations. In such a circumstance, upon failure detection in one of the motor/compressor combinations, the other motor/compressor needs to be isolated from operating part of the system. Accordingly, for this purpose, shutoff valves 141 and 142 are actuated simultaneously to isolate compressor 101a. In a similar fashion, shutoff valves 143 and 144 serve to isolate compressor 101b. This embodiment also employs HGBV 97 which functions as described above.

Figure 7:
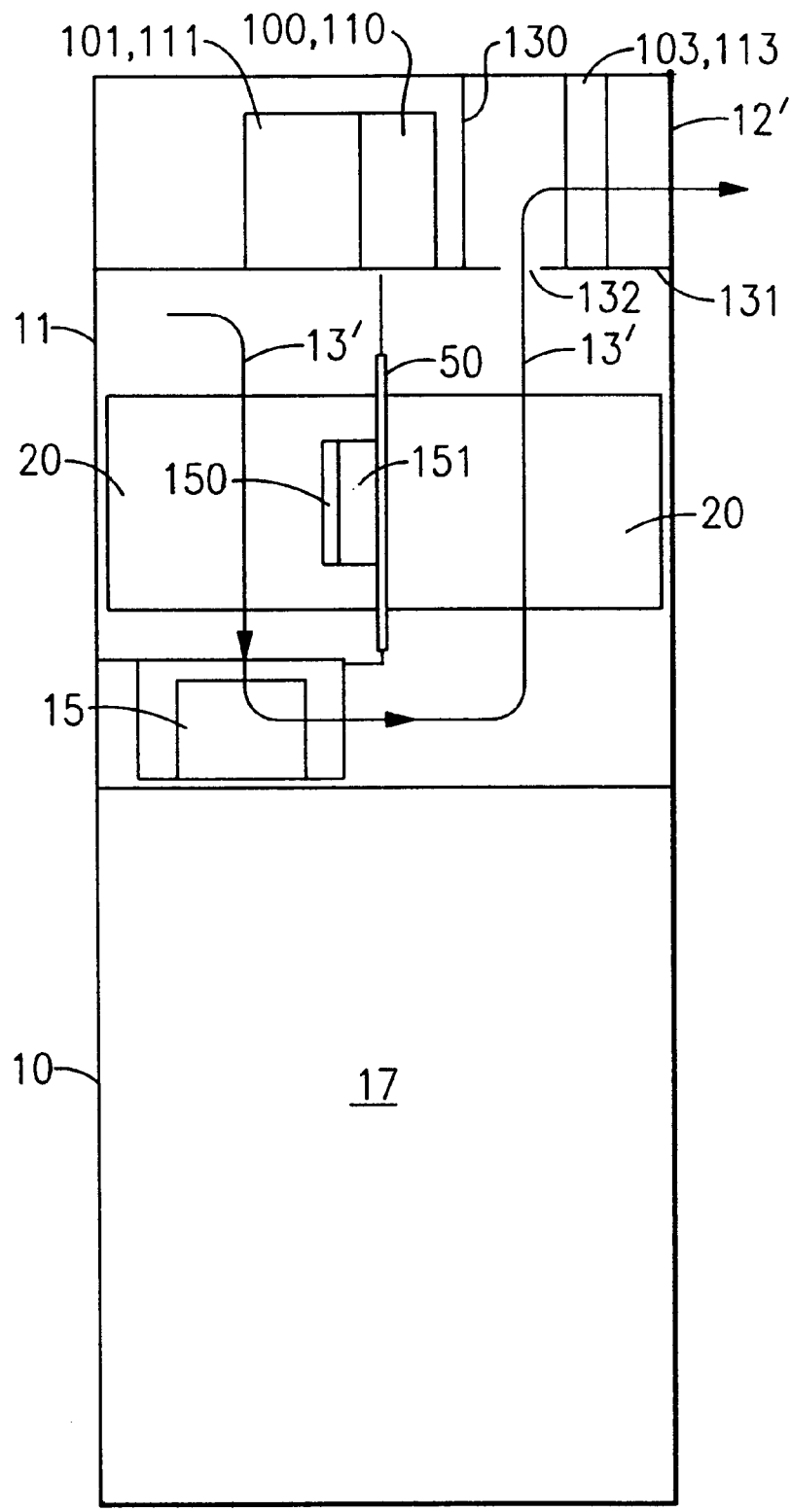
FIG. 7 is a side elevation view similar to FIG. 1A but more particularly illustrating an alternative air flow path.

Another embodiment of the present invention is illustrated in FIG. 7. FIG. 7 is similar to FIGS. 1A and 1B but it more particularly illustrates the fact that a different air circulation flow path 13' may be provided which also acts to remove heat from condensers 103 and/or 113. This mechanism is provided by opening 132 in shelf 131 (in cabinet 10) which supports the refrigeration components. Correspondingly, exhaust opening 12 is moved upward to position 12', as shown in FIG. 7. Since it is primarily desirable that the condensers be cooled as opposed to the motor-compressor combinations which may or may not require cooling, barrier 130 is provided to ensure that air flow path 13' is directed across condensers 103 and 113 through exhaust opening 12'.

Attention is next directed to the design of cold plate 150 (or 150' or 150" as appropriate). The embodiments shown in FIGS. 8A, 8B, 9A, 9B, 10A, 10B, 10C, 11A and 11B are particularly directed to those situations in which redundancy is provided in a manner which includes two entirely separate and distinct cooling circuits (referred to above as circuits A and B). These figures also include section lines B and C since, in each case, cross-sectional views are provided for a better understanding of the structure of the cold plate. In all of the cold plate embodiments illustrated in FIGS. 8–11, separate but thermally coupled flow passages are provided. In preferred embodiments of the present invention, cold plates illustrated in FIGS. 8–11 preferably comprise a material such as aluminum or copper. However, any highly thermally conductive material may be employed. However, it is desirable that the material be relatively easily machinable. Also, because it would be clearly difficult to provide a serpentine channel embedded in a monolithic piece of material, each of the cold plate constructions illustrated in FIGS. 8–11 employ a central path defining structure (200, 300, 400, 500) together with top plates (210, 310, 410, 510) and bottom plates (220, 320, 420, 520), respectively.

Figure 8B:
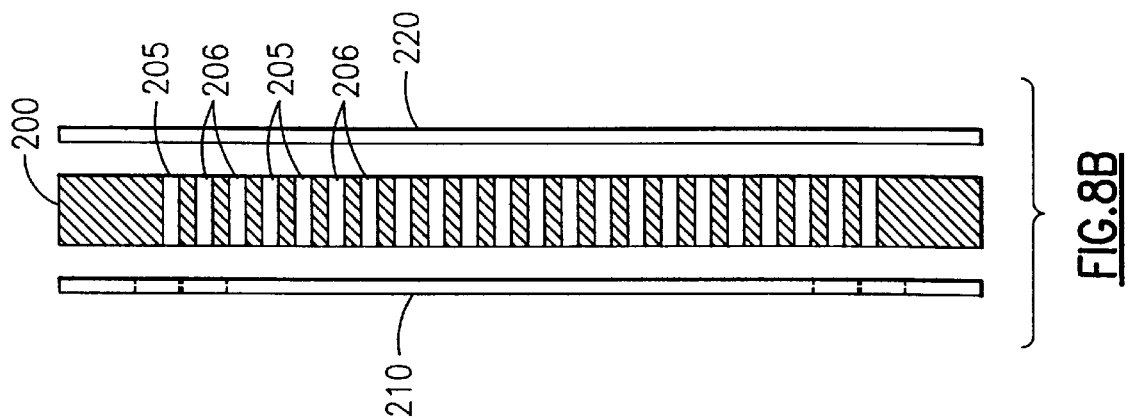
FIG. 8B is a side elevational cross-sectional view of the cold plate portion shown in FIG. 8A together with upper and lower sealing plates.
Figure 8A:
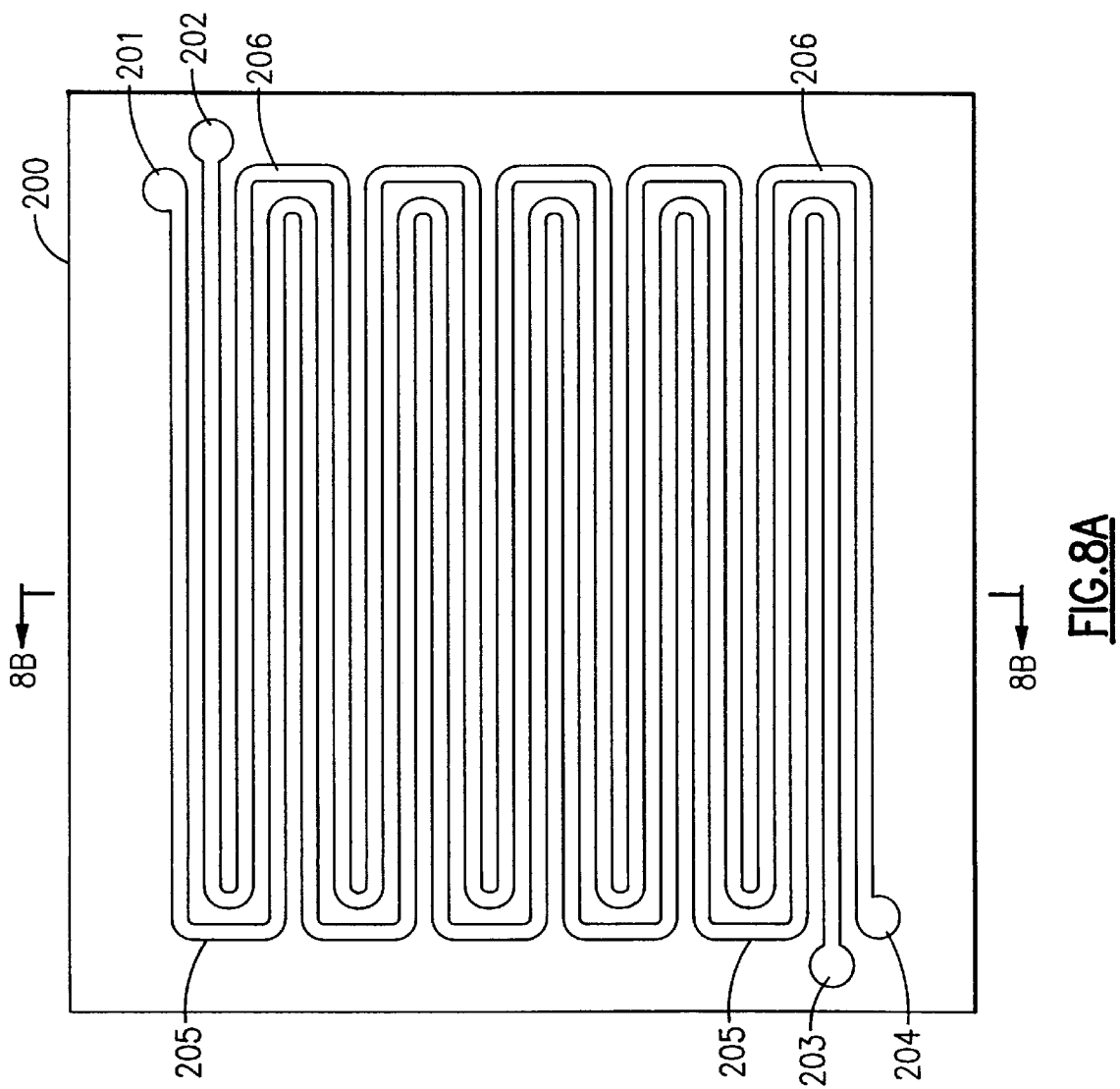
FIG. 8A is a top view of a central cold plate portion which provides the desired degree of thermal coupling and flow isolation desired in the present invention.

In one embodiment of a desirable cold plate such as that illustrated in FIGS. 8A and 8B, serpentine but isolated passages 205 and 206 are provided so that they co-exist at the same depth within central block 200. For purposes of cooling uniformity, both sets of passages 205 and 206 are arranged in a symmetric, serpentine, interdigitated fashion, such as that shown. Furthermore, passage 205 is provided with inlet opening 201 and exit opening 203. In a similar fashion, passage 206 is provided with outlet opening 202 and inlet opening 204. In this regard, it is particularly noted that, in preferred embodiments of the present invention, the dual passage cold plate is connected into the refrigeration system so that the inlet for circuit A is adjacent to the outlet for circuit B in the cold plate itself. In those circumstances where both circuits are being operated at the same time, this arrangement provides a more uniform cooling of the electronic module. This same preference also applies to the cold plate embodiment illustrated in FIGS. 9A and 9B.

Figure 9B:
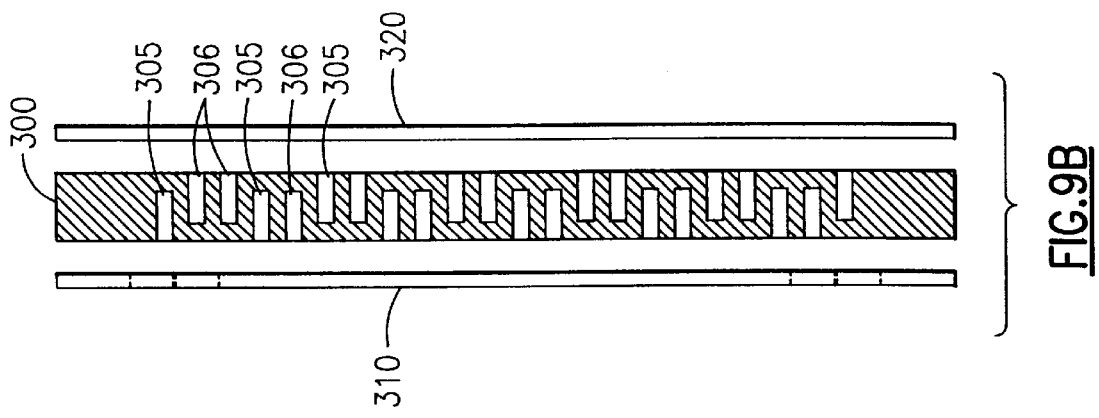
FIG. 9B is a cross-sectional view of the cold plate portion of FIG. 9A further including top and bottom sealing plates.
Figure 9A:
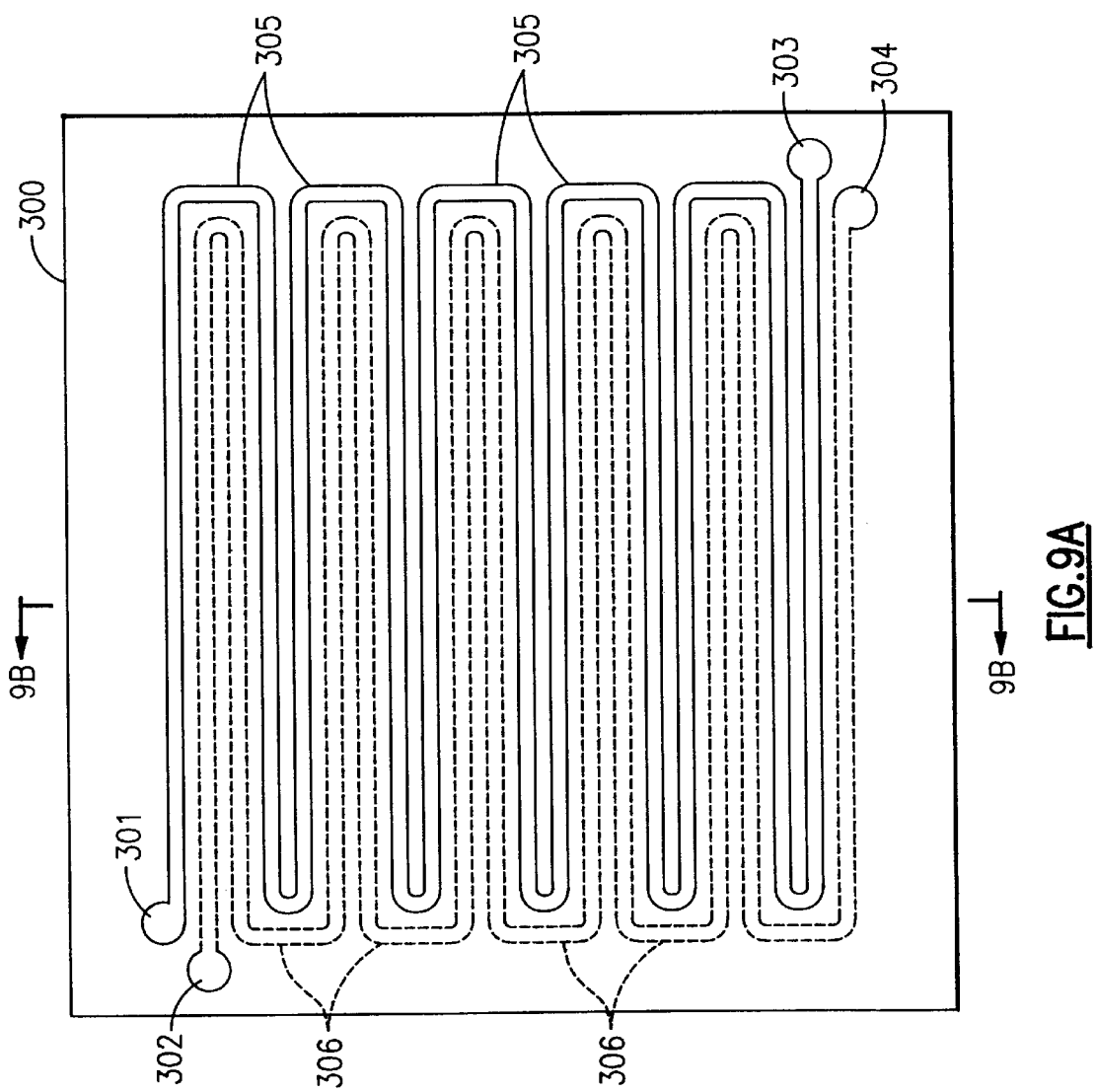
FIG. 9A is a view similar to FIG. 8A but more particularly illustrating a situation in which the flow paths are provided in more isolated channels on opposite sides of the central plate portion.

In particular, the cold plate design shown in FIGS. 9A and 9B is such that separate cooling passages 305 and 306 are provided in much the same way as shown in FIGS. 8A and 8B except that passage 306 lies at the bottom of the cold plate while passage 305 is disposed at the top (as seen in FIG. 9A). This is more particularly illustrated in the cross-sectional view shown in FIG. 9B. In the same manner as discussed above, passage 305 includes inlet opening 301 and exit opening 303 for connection to coolant circuit A or B. In a similar manner, passage 306 is provided with exit opening 302 and entrance opening 304. Naturally, the role of exit and entrance openings can be reversed in the cold plate design shown in any of FIGS. 8A–10C.

Another embodiment for a dual passage cold plate is shown in FIGS. 10A–10C. In this particular embodiment, instead of providing serpentine, interdigitated passages, passages 405 and 406 are straight but still maintain their interdigitated geometry. Instead of having a serpentine geometry, each set of passages is instead served by an entrance and exit manifold. For example, upper passages 405 in FIG. 10A are served by manifold 407 which is in flow communication with coolant connection opening 402. Cooling fluid flows in through opening 402 to manifold 407 through passages 405 to exit manifold 408 and alternately to exit opening 404. A corresponding function is provided via entrance opening 403 which serves a manifold which supplies passages 406 which empties into an exhaust manifold which in turn supplies heated coolant fluid to exit opening 401 which services the lower set of cooling passages.

Figure 11B:
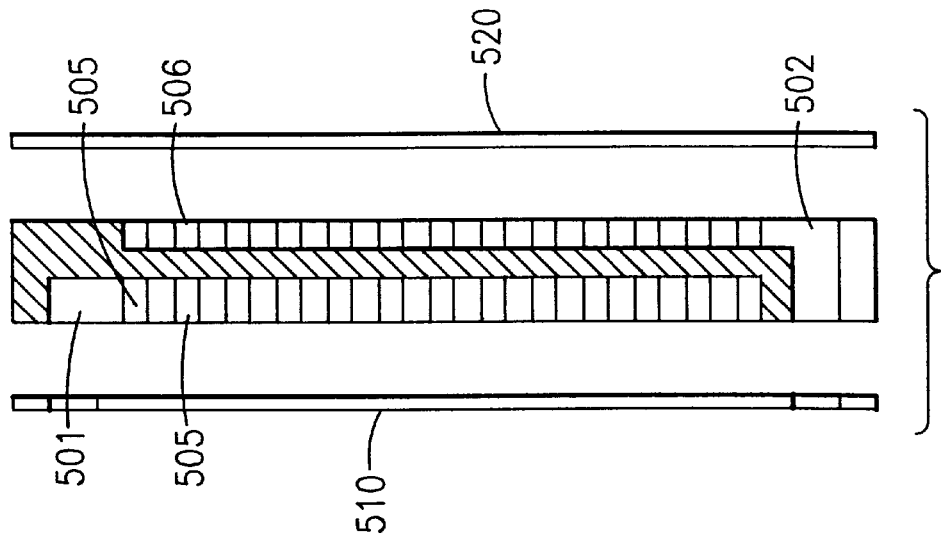
FIG. 11B illustrates a cross-sectional view through the cold plate of FIG. 11A.
Figure 11A:
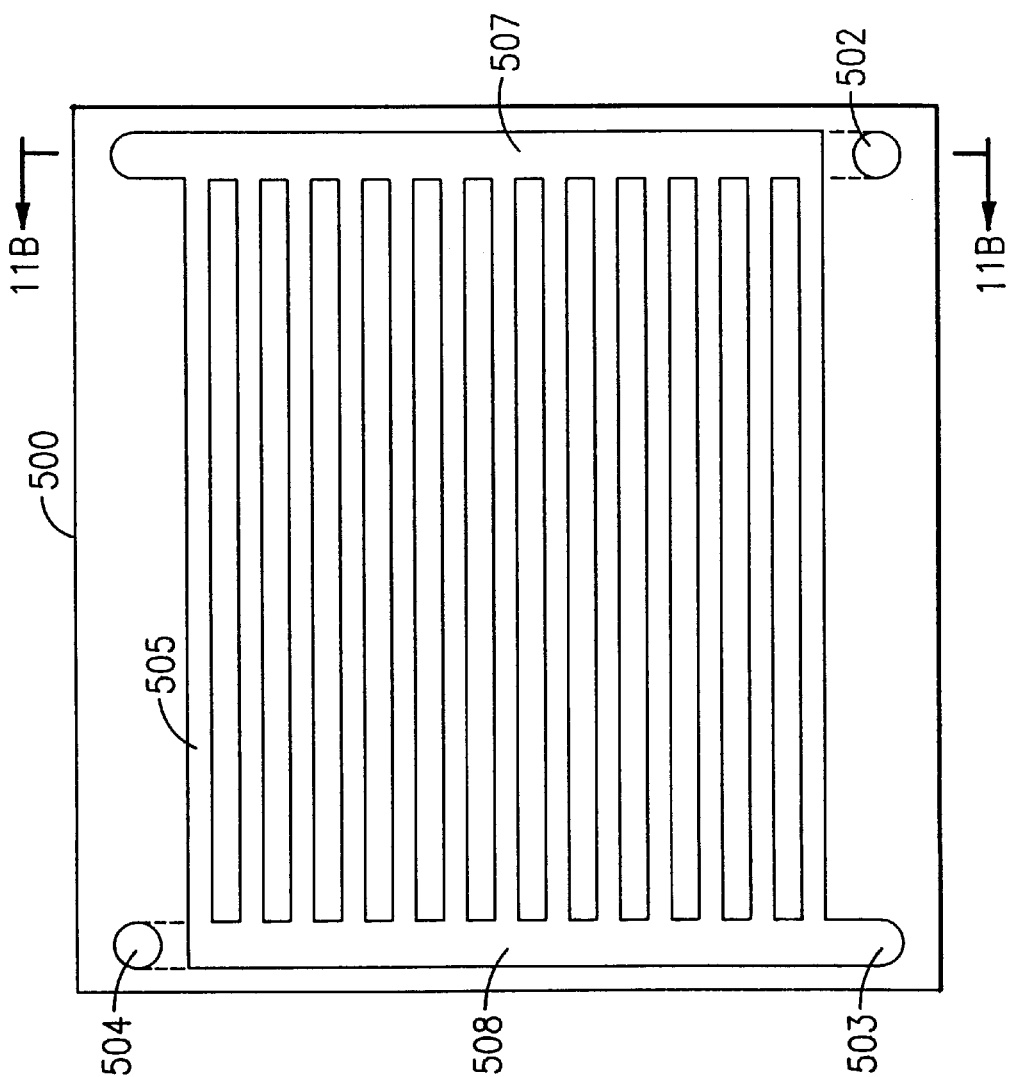
FIG. 11A is a view similar to FIG. 10A but particularly illustrating an embodiment in which the flow channels in the top and bottom portions are disposed adjacent to one another instead of being in alternating positions.

A fourth embodiment of a dual passage cold plate is shown in FIGS. 11A and 11B. In this embodiment, a multiplicity of straight passages 505 and 506 are provided on each side of central block 500. Upper passages 505 in FIG. 11A are served by manifold 507 which is in flow communication with coolant connection opening 501. Cooling fluid flows in through opening 501 to entrance manifold 507 through passages 505 to exit manifold 508 and through outlet opening 503. A corresponding function is provided for the lower set of passages via entrance opening 502 which supplies passages 506 emptying into an exhaust manifold allowing heated coolant to leave via exit opening 504. It should be understood that, in this arrangement, heat entering the cold plate structure across bottom plate 520 has a greater distance to travel to reach upper passages 505 and thereby exhibits a greater thermal resistance than for bottom passages 506, all other things being equal. It should be appreciated, however, that an increased number of cooling passages may be placed in the cold plate in this configuration and that, additionally, an increased number of passages 505 may be used on the top than on the bottom so as to offset the longer heat flow path and provide the same overall thermal resistance whether coolant flows through upper passages 505 or lower passages 506.

The upper and lower plates for the cold plates illustrated in FIGS. 8–11 are affixed to central blocks 200, 300, 400, 500 in any convenient fashion. For example, they can be attached by brazing, soldering or even by gluing. However, in the case of attachment via epoxy, it is desired that the thermal resistance created by the attachment, particularly for the lower cover, is within an acceptable range. As indicated above, it is one of the primary objectives of the cold plate design employed herein to preserve flow-wise isolation between the coolant flow in the two sets of passages. It should be particularly noted that the embodiments illustrated in FIG. 9A, 9B, 10A, 10B, 10C, 11A and 11B are particularly advantageous in this regard. These embodiments completely eliminate the possibility of fluid leaking between the two circuits within the cold plate.

In preferred embodiments of the present invention, it is clearly desirable that the cold plate be made as flat as possible to conform to the exterior packaging of electronic module 151. However, in those circumstances in which module 151 comprises a curved or even a stepped design, it is nonetheless possible to provide an appropriate cold plate by correspondingly machining or molding one of the upper or lower plates (covers) shown in FIGS. 8–11. However, in general, a good flat thermal mating surface is preferable.

Figure 12:
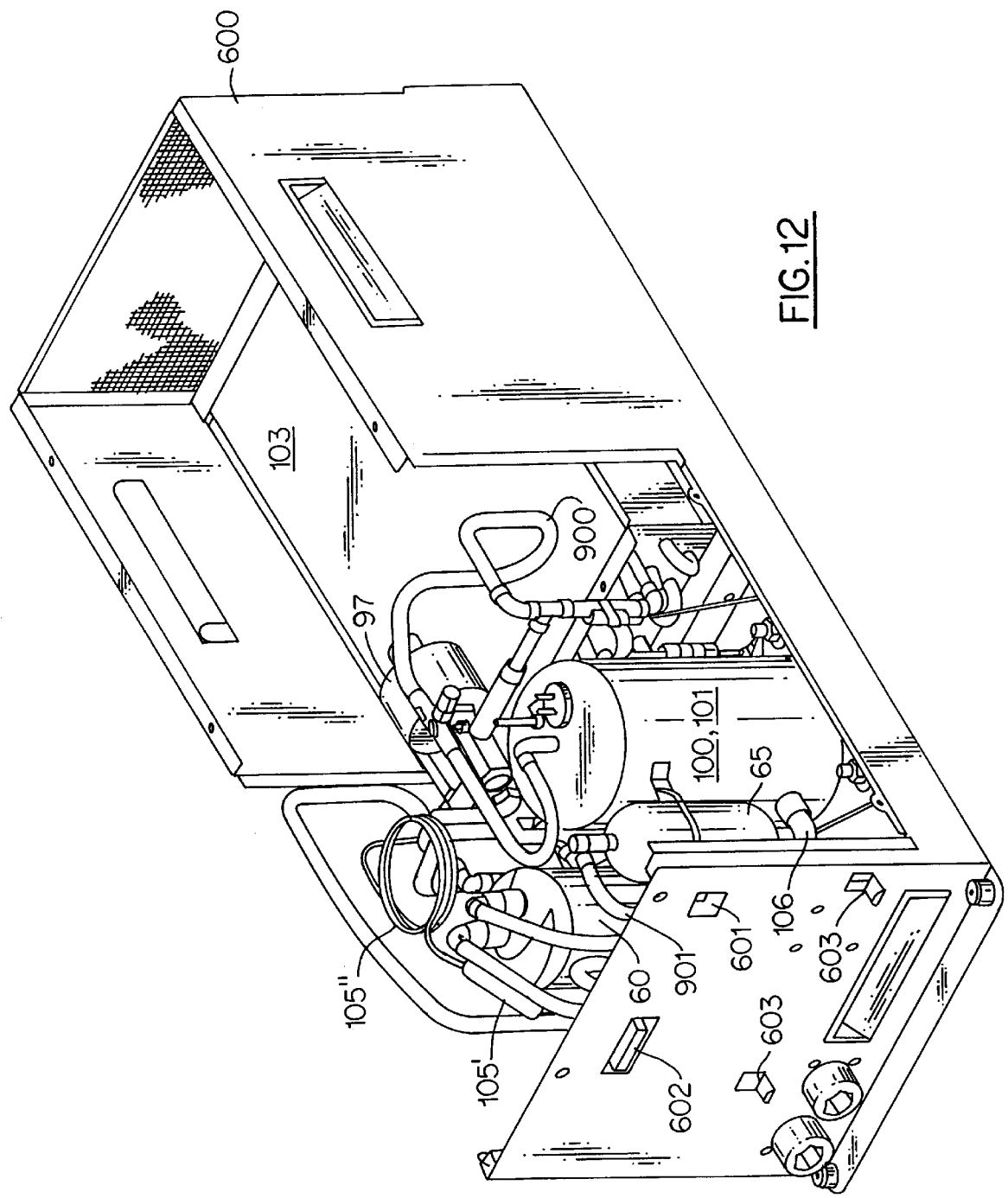
FIG. 12 is an isometric view illustrating the modular refrigeration unit of the present invention with covers removed to provide an internal view of the configuration of its subcomponents and also particularly illustrating anti-vibration tubing configuration.

FIG. 12 is an isometric view illustrating a preferred configuration for one side of the modular refrigeration system illustrated in FIG. 2. In particular, it is seen that cabinet or housing 600 contains condenser 103 which is of substantially standard design except that it preferably includes S-shaped aluminum fins which create an improved flow of cooling air through condenser 103. Furthermore, condenser 103 preferably includes tubing having rifled internal ridges to improve its efficiency. These are fine internal ridges which help to promote heat transfer. Likewise, FIG. 12 illustrates the presence of motor/compressor unit 100, 101, hot gas bypass valve 97 and two portions, bulb 105' and coiled loop 105", of the thermal expansion device. Large accumulator 60, together with smaller accumulator 65, are also shown. It is also important to note the presence of loops 900 and 901 in coolant conduits. These loops have been seen to be very desirable additions to the structure in that they help to eliminate vibration in the system. Vibration could otherwise be a problem particularly at low motor speeds.

Figure 13:
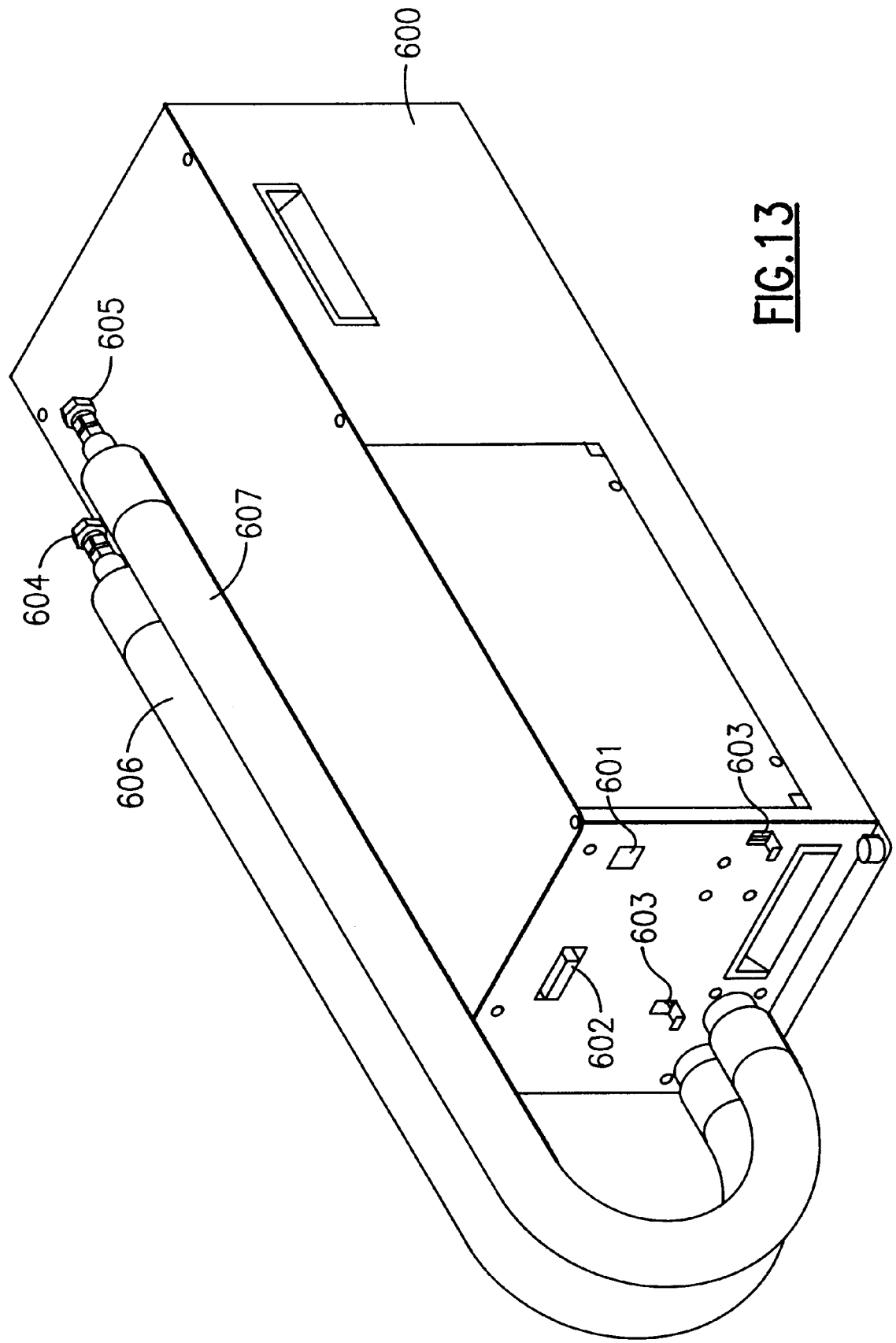
FIG. 13 is an isometric view similar to FIG. 12, but more particularly illustrating a closed MRU together with its quick disconnect connectors for attachment to a cold plate and/or evaporator.

It is also noted that cabinet or housing 600 includes four-pin socket 601 for supplying power to motor/compressor 100,101 and bracket 603 for supporting a printed circuit board containing control circuitry. Signals to and from this board may be supplied via multi-pin DIN socket 602. Connection to evaporator/cold plate 150 is provided through quick disconnect couplers 604 and 605. FIG. 13 more particularly shows the closed cabinet together with quick disconnect conduits 606 and 607 which are attached to quick disconnect sockets 604 and 605, respectively, as a means for supplying cooled refrigerant to evaporator/cold plate 150.

From the above, it should be appreciated that the systems and apparatus described herein provide a reliable redundant cooling system for computer and other electronic systems. It should also be appreciated that the cooling systems of the present invention permit the operation of computer systems at increased speeds. It should also be appreciated that the objects described above have been filled by the systems and methods shown herein particularly with respect to the utilization of a cold plate having dual flow-wise isolated but thermally coupled passages.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A cold plate flow-wise isolated dual passages, said cold plate comprising:

a central plate having a first set of substantially parallel channels therein extending substantially through said plate from a first side of said central plate, said first set of channels being connected to a common first inlet manifold at one end thereof and to a common first outlet manifold at the other end thereof, said first inlet and first outlet manifolds also possessing, respectively, first inlet and first outlet openings, said central plate also having a second set of substantially parallel channels therein extending substantially through said plate from a second side of said central plate, said second set of channels being connected to a common second inlet manifold at one end thereof, said second inlet and second outlet manifolds also possessing, respectively, second inlet and second output openings, said first set of channels being disposed between said second set of channels;

a top plate sealably affixed to the first side of said central plate, said top plate having openings therein to provide access to said first and to said second inlet and outlet openings; and a bottom plate sealably affixed to the second side of said central plate, whereby two separate and flow-wise isolated passages are formed.

2. The cold plate of claim 1 in which said first and second sets of substantially parallel channels are arranged in a substantially interdigitated fashion.

3. The cold plate of claim 1 in which the channels in said second set are spaced more closely together and are more numerous than the channels in said first set.

* * * * *

UNITED STATES PATENT AND TRADEMARK OFFICE
CERTIFICATE OF CORRECTION

PATENT NO. : 5,896,922  
DATED : April 27, 1999  
INVENTOR(S) : Gregory M. Chrysler, et al Page 1 of 2

It is certified that error appears in the above-indentified patent and that said Letters Patent is hereby corrected as shown below:

On the title page, item [63], insert the following:

U. S. PATENT DOCUMENTS

| EXAMINER INITIAL | | PATENT NUMBER | | | | | | ISSUE DATE | PATENTEE | CLASS | SUBCLASS | FILING DATE IF APPROPRIATE |
|---|---|---|---|---|---|---|---|---|---|---|---|---|
| | | 4 | 3 | 7 | 2 | 1 | 2 | 9 | 02/08/83 | Bennett, et al. | | | |
| | | 4 | 7 | 7 | 1 | 8 | 2 | 3 | 09/20/88 | Chan | | | |
| | | 4 | 9 | 6 | 2 | 4 | 4 | 4 | 10/09/90 | Niggemann | | | |
| | | 5 | 0 | 3 | 8 | 8 | 2 | 7 | 08/13/91 | Heffner, et al. | | | |
| | | 5 | 0 | 5 | 8 | 3 | 9 | 1 | 10/22/91 | Periot | | | |
| | | 5 | 2 | 8 | 5 | 3 | 4 | 7 | 02/08/94 | Fox, et al. | | | |
| | | | | | | | | | | | | |
| | | | | | | | | | | | | |

UNITED STATES PATENT AND TRADEMARK OFFICE
CERTIFICATE OF CORRECTION

PATENT NO. : 5,896,922
DATED : April 27, 1999
INVENTOR(S) : Gregory M. Chrysler, et al It is certified that error appears in the above-indentified patent and that said Letters Patent is hereby corrected as shown below:

FOREIGN PATENT OR PUBLISHED FOREIGN PATENT APPLICATION

| | | DOCUMENT NUMBER | PUBLICATION DATE | COUNTRY OR PATENT OFFICE | CLASS | SUBCLASS | TRANSLATION YES | NO |
|---|---|---|---|---|---|---|---|---|
| | | | | | | | | |
| | | | | | | | | |
| | | | | | | | | |
| | | | | | | | | |
| | | | | | | | | |
| | | | | | | | | |
| | | | | | | | | |
| | | | | | | | | |

Signed and Sealed this

Ninth Day of November, 1999

Attest:

Q. TODD DICKINSON

Attesting Officer

Acting Commissioner of Patents and Trademarks